(12) United States Patent
Marlow et al.

(10) Patent No.: US 7,015,869 B2
(45) Date of Patent: Mar. 21, 2006

(54) HIGH FREQUENCY ANTENNA DISPOSED ON THE SURFACE OF A THREE DIMENSIONAL SUBSTRATE

(75) Inventors: C. Allen Marlow, Saline, MI (US); Jay DeAvis Baker, West Bloomfield, MI (US); Lawrence Leroy Kneisel, Novi, MI (US); Rosa Lynda Nuño, Berkley, MI (US); William David Hopfe, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 275 days.

(21) Appl. No.: 10/298,434

(22) Filed: Nov. 18, 2002

(65) Prior Publication Data

US 2004/0095214 A1 May 20, 2004

(51) Int. Cl.
*H01Q 19/00* (2006.01)

(52) U.S. Cl. .................. 343/850; 333/246; 333/247; 257/664; 174/266

(58) Field of Classification Search ............... 333/246, 333/247; 174/262, 266; 257/664; 343/850
See application file for complete search history.

(56) References Cited

U.S. PATENT DOCUMENTS

| | | | |
|---|---|---|---|
| 3,561,107 A | 2/1971 | Best et al. | |
| 4,179,802 A | 12/1979 | Joshi et al. | ............ 29/628 |
| 4,607,242 A | 8/1986 | Cozzie | |
| 4,724,472 A | 2/1988 | Sugimoto et al. | |
| 4,908,587 A | 3/1990 | Davcev | |
| 5,012,047 A | 4/1991 | Dohya | |
| 5,160,907 A * | 11/1992 | Nakajima et al. | ............ 333/246 |
| 5,624,741 A * | 4/1997 | Scott | ........................ 428/210 |
| 5,640,052 A | 6/1997 | Tsukamoto | ............... 257/781 |
| 5,982,250 A | 11/1999 | Hung et al. | |
| 6,118,357 A * | 9/2000 | Tomasevic et al. | ......... 333/247 |
| 6,160,463 A | 12/2000 | Arakawa et al. | |
| 6,181,278 B1 * | 1/2001 | Kakimoto et al. | ... 343/700 MS |
| 6,346,867 B1 | 2/2002 | Arakawa et al. | |
| 6,356,170 B1 | 3/2002 | Arakawa et al. | |
| 6,400,241 B1 | 6/2002 | Ulian et al. | |

FOREIGN PATENT DOCUMENTS

| | | |
|---|---|---|
| JP | 61-99361 | 5/1986 |
| JP | 4-107989 | 4/1992 |
| WO | WO 01/41517 | 6/2001 |

* cited by examiner

*Primary Examiner*—Benny T. Lee
(74) *Attorney, Agent, or Firm*—Brinks Hofer Gilson & Lione

(57) ABSTRACT

The present invention consists of an electrical communications device including a three-dimensional substrate and a plurality of electrical devices attached thereto. The substrate is preferably a dielectric. The electrical device is preferably of the sort needed to conduct high frequency communications, such as a microwave antenna and photonic receivers and transmitters. The electrical devices are attached to the substrate at the connection points described by the intersection of a series vias and one of the substrate surfaces. The electrical devices are attached to the substrate in numerous ways, including solder, flipped chip ball bonds, wire bonds, or a gold stud assembly. In particular, the gold stud assembly is utilized to attach the antenna to the substrate, thereby providing a predetermined air gap therebetween.

6 Claims, 3 Drawing Sheets

HIGH FREQUENCY ANTENNA DISPOSED ON THE SURFACE OF A THREE DIMENSIONAL SUBSTRATE

FIELD OF THE INVENTION

The present invention relates to an electrical communications apparatus, and more particularly to a light channel communications device for high-frequency antenna communications applications.

BACKGROUND AND SUMMARY OF THE INVENTION

Microwave and optical wavelength communications are generally carried out by extremely high frequency nodes. A central controller is responsible for the command and control of a diffuse network of individual nodes. The networking between the central controller and the nodes is wireless, and the signals are transmitted through lasers or microwaves.

Sophisticated communications require complex and expensive hardware, including antennas, photoreceptors, solid-state lasers, and processors, all of which must be compact and efficiently arranged. One consequence of the packaging of these components is the general deterioration of the electrical signals and the loss of fidelity in the data transmission. The consequences include electrical losses and interference, inductive and capacitive parasitics, propagation delays, signal-to-signal skews, signal-to-signal coupling, decreased signal strength, and alteration in the phase relationship between the voltage and current components of a signal.

Accordingly, the present invention is an electrical communications apparatus that minimizes the signal losses and interferences while maintaining the fidelity of the data transmissions. Moreover, the present invention includes all of the sophisticated hardware referenced above, but packaged in an efficient and cost-effective assembly The present invention includes a dielectric material defining a volume and at least one via inscribed within the dielectric material. The at least one via intersects the volume at a first planar surface, a second planar surface, or the third planar surface thereby providing a plurality of connection points on the first planar surface, the second planar surface, and the third planar surface. The via is preferably composed of a conductive material. In one embodiment, the first planar surface, the second planar surface, and the third planar surface intersect along a first line, a second line, and a third line, and the first line, the second line, and the third line are mutually perpendicular. This configuration generally defines a cubic volume.

The dielectric material, or substrate, has at least one electrical device attached thereto. The electrical device is preferably of the sort needed to conduct high frequency communications, such as an antenna. The electrical device is attached to the substrate at the connection points described by the intersection of the vias and one of the planar surfaces. The electrical device may be attached to the substrate in numerous ways, including solder, flipped chip ball bonds, wire bonds, or a gold stud assembly. In particular, the gold stud assembly is utilized to attach an antenna to the substrate, thereby providing a predetermined air gap therebetween.

DETAILED DESCRIPTION OF THE INVENTION

Figure 1:
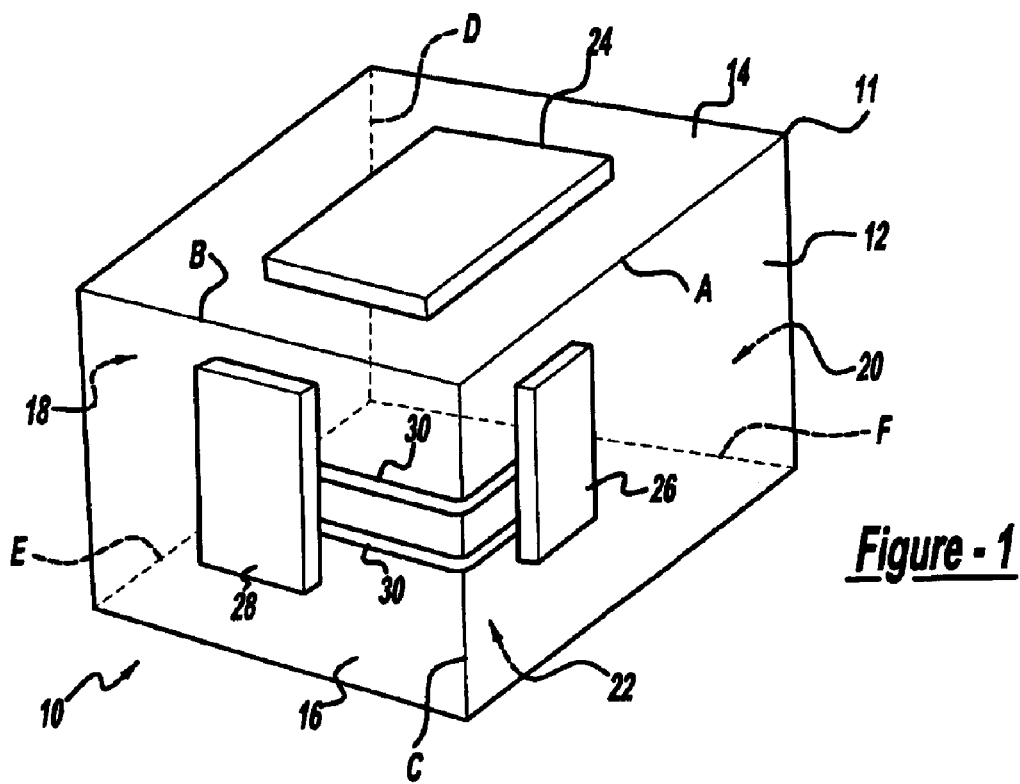
FIG. 1 is a schematic depiction of the electrical communications apparatus in accordance with the present invention.

In accordance with a preferred embodiment of the present invention an electrical communications apparatus 10 is provided in FIG. 1. The electrical communications apparatus 10 is generally composed of a substrate 11 with a number of electrical devices 24, 26, 28 attached thereto. While three electrical devices are illustrated, it is understood that a greater or lesser number of electrical devices could be employed. The electrical devices 24, 26, 28 are in communication by, for example, the traces 30 connecting electrical device 26 to electrical device 28.

As shown in FIG. 1, the substrate 11 defines a volume that is bounded on six sides, thereby defining a plurality of planar surfaces. More particularly, the substrate 11 defines a volume having a first planar surface 12, a second planar surface 14, a third planar surface 16, a fourth planar surface 18, a fifth planar surface 20, and a sixth planar surface 22. The substrate 11 is preferably composed of a dielectric material.

The first planar surface 12 and the second planar surface 14 intersect along a line A. The first planar surface 12 and the third planar surface 16 intersect along a line B. The second planar surface 14 and the third planar surface 16 intersect along a line C. As shown in FIG. 1, lines A, B, and C are mutually perpendicular. Similarly, the fourth planar surface 18 and the fifth planar surface 20 intersect along a line D. The fourth planar surface 18 and the sixth planar surface 22 intersect along a line E. The fifth planar surface 20 and the sixth planar surface 22 intersect along a line F. As shown in FIG. 1, lines D, E and F are mutually perpendicular. More particularly, the substrate 11 of FIG. 1 is cubical in nature, such that lines A and E, B and F, and C and D are all parallel, respectively.

Figure 2:
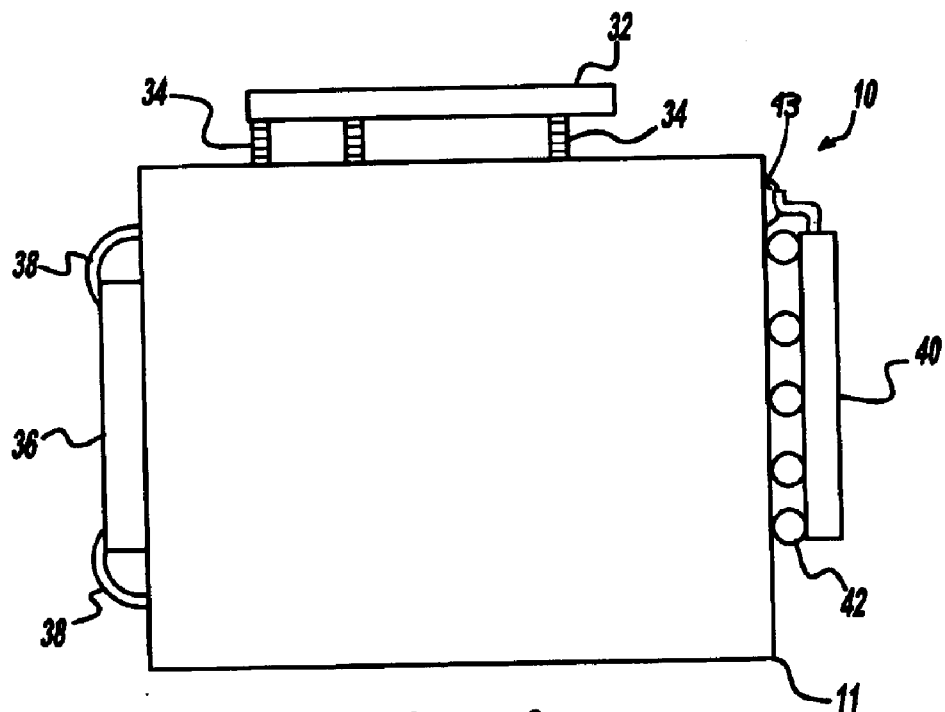
FIG. 2 is a schematic cross-sectional view of the electrical communications apparatus in accordance with a preferred embodiment of the present invention.

FIG. 2 is a cross-section view of the electrical communications apparatus 10 of the present invention. The substrate 11 in this FIG. is shown having a second group of electrical devices 32, 36, 40 attached thereto. The electronic devices 32, 36, 40 may be attached to the substrate in an alternate number of ways. For example, the electronic device 32 is illustrated as being attached to the substrate 11 via a gold stud assembly 34 which is particularly adapted for distancing the electronic device 32 from the substrate 11. Alternatively, the electronic device 36 is illustrated as being attached to the substrate 11 via bond wires 38. Electronic device 40 is illustrated as being attached to the substrate via a set of flipped chip ball bonds 42. The foregoing means of attaching the respective electronic devises are used alternatively, either in combination or individually, to the common method of solder 43.

Figure 3:
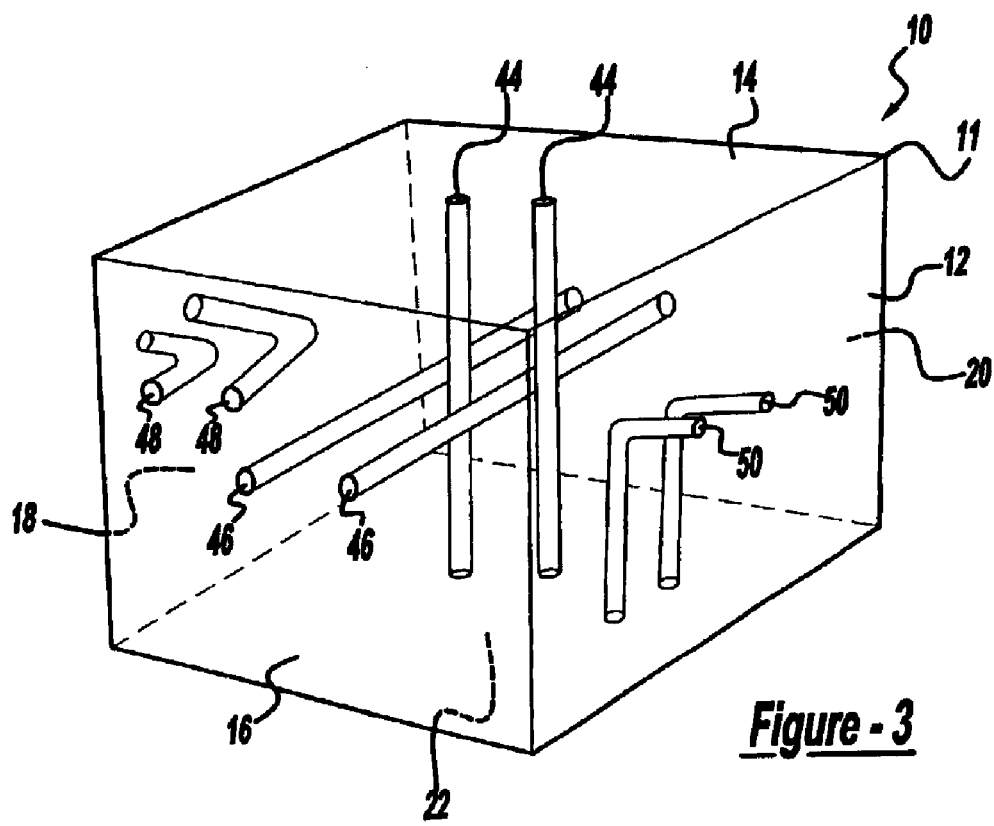
FIG. 3 is a schematic depiction of the electrical communications apparatus of the present invention particularly showing a plurality of vias in accordance with an embodiment of the present invention.

The electronic devices 32, 36, 40 shown in FIG. 2 are in communication with one another through at least one via, as shown in FIG. 3. As used herein, a via is a channel that runs through the substrate 11 and is subsequently filled with a conductive metal. For these purposes, the term via will refer to both the channel and its conductive properties. The via intersects at least two of the planar surfaces at a point such that a small trace is formed on the substrate 11 that is suitable for attaching an electrical device.

The electrical communication apparatus 10 of FIG. 3 includes the substrate 11 having a plurality of vias 44, 46, 48, 50 arranged within. For example, vias 44 run parallel from the second planar surface 14 to the sixth planar surface 22 through the center of the substrate 11. Similarly, vias 46 run from the third planar surface 16 to the fifth planar surface 20 through the center of the substrate 11. In the preceding example, the vias 46, 48 may be used to conduct electrical signals across the width of the substrate 11 without having to traverse the perimeter of the substrate 11, thereby decreasing the overall length of the conductive pathway.

Similarly, vias may be used to conduct electrical signals through the substrate to adjacent surfaces. For example, FIG. 3 shows vias 48 that run from the third planar surface 16 to the fourth planar surface 18. Similarly, vias 50 may transmit electrical signals from the first planar surface 12 to the sixth planar surface 22.

Figure 4:
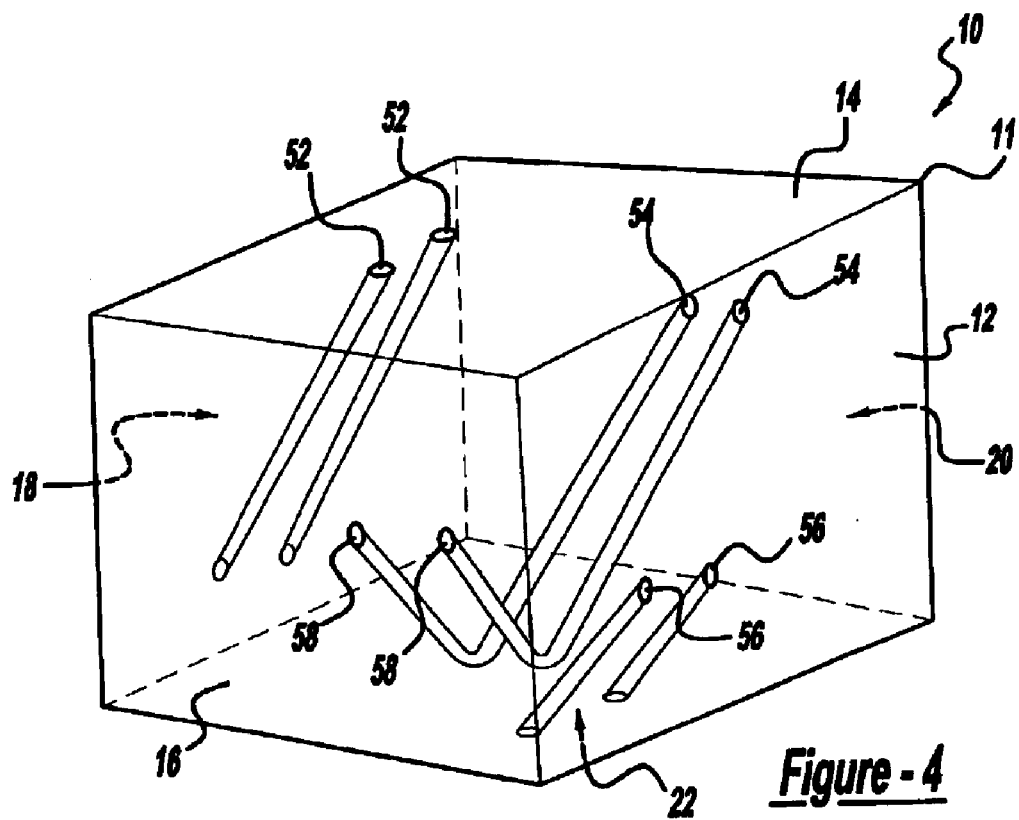
FIG. 4 is a schematic depiction of the electrical communications apparatus of the present invention particularly showing a plurality of vias in accordance with an embodiment of the present invention.

An alternative system of vias is shown in FIG. 4. This system includes vias 52, 54, 58, 58 that extend at various angles through the substrate 11. For example vias 52 provide an electrical connection between the second planar surface 14 and the fourth planar surface 18. Vias 56 diagonally connect the first planar surface 12 with the sixth planar surface 22. Vias 54 and v as 58 jointly connect the third planar surface 18 and the fifth planar surface 20 while intersecting at the sixth planar surface 22, forming an elbow connection at the sixth planar surface 22.

Figure 5:
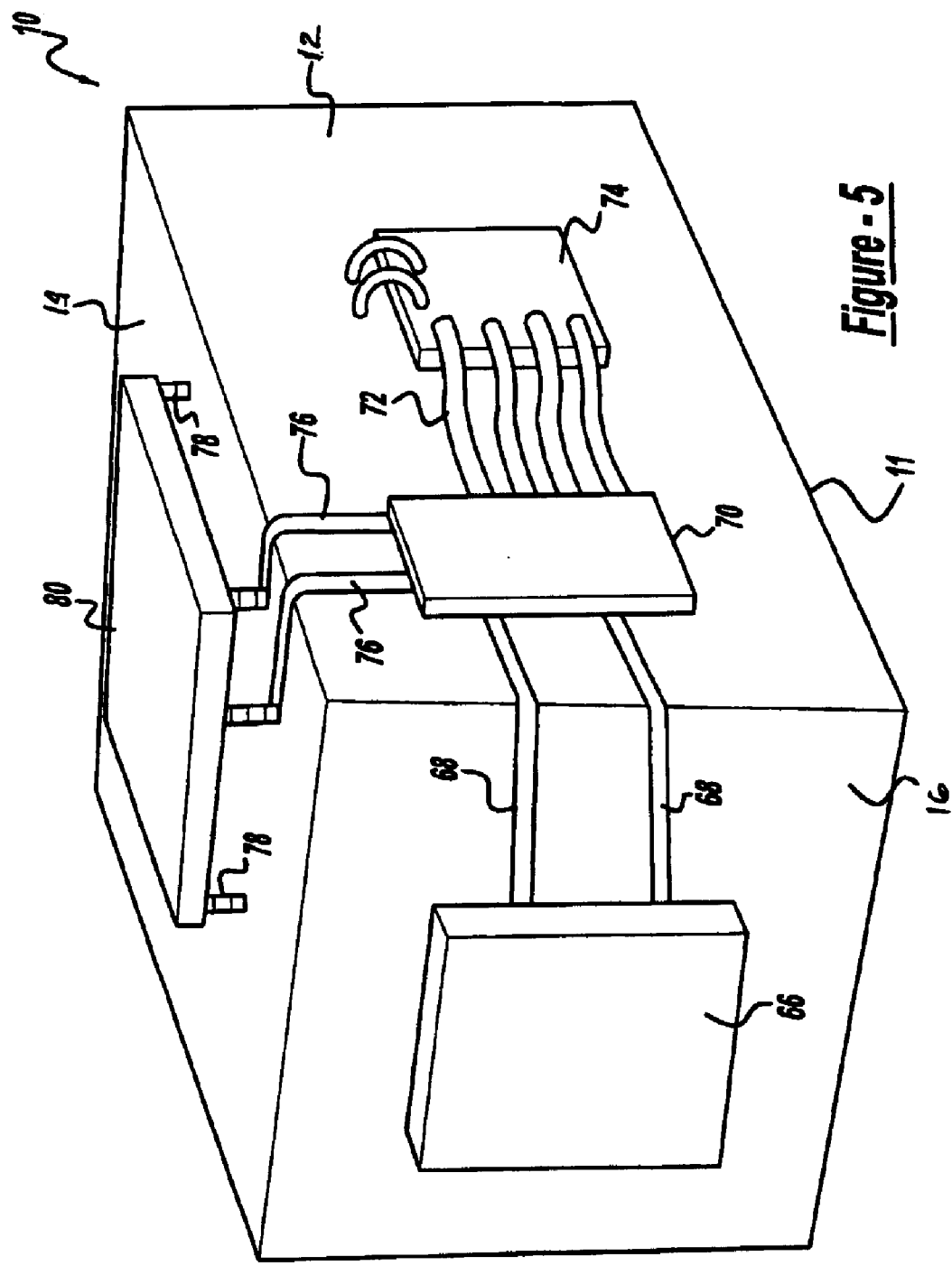
FIG. 5 is a perspective view of the electrical communications apparatus in a preferred embodiment.

FIG. 5 is a perspective view of the electrical communications apparatus 10 of the present invention. The substrate 11 is shown with the first planar surface 12, the second planar surface 14, and the third planar surface 16 being viewable from the illustrated perspective. A number of electrical devices are attached to the substrate 11. A first electrical device 66, located on the third planar surface 16, is connected to a second electrical device 70, located on the first planar surface 12, by a pair of traces 68 disposed on these surfaces 12, 16 of the substrate 11. The second electrical device 70, is coupled to a third electrical device 74, also located on the first planar surface 12, and to a fourth electrical device 80, located on the second planar surface 14, by surface traces 72, 76, respectively.

In its preferred embodiment, the electrical communications apparatus 10 of the present invention is a high frequency antenna communications system. In particular, the fourth electrical device 80 is preferably a GaAs antenna. The GaAs antenna 80 is coupled to the substrate 11 by a gold stud assembly 78. The gold stud assembly 78 is particularly useful in coupling the GaAs antenna 80 to the substrate 11 because the size of the air gap can be predetermined to maximize the overall performance of the electrical communications device 10.

The first electrical device 66, second electrical device 70, and third electrical device 74 generally comprise an optical communications cluster that is particularly adapted for use in a phased array antenna. In the phased array antenna embodiment, the first electrical device 66 is a CMOS controller, the third electrical device 74 is a PIN diode, and the second electrical device 70 is a vertical cavity surface emitting laser (VCSEL).

As part of a phased array antenna, the electrical communications apparatus 10 is arranged such that it is optically coupled to a centralized antenna and data transmitter (not shown). The communication and data transmission between the centralized antenna and the electrical communications device 10 is carried out by photons. The PIN diode 74 receives incident light signals from the centralized antenna and converts the incident signal into an electrical signal. The electrical signal is processed by the CMOS controller 66, and a reply or function is executed by the VCSEL 70 or the GaAs antenna 80. The VCSEL 70 emits a laser signal that contains the necessary data, while the GaAs antenna 80 emits extremely high frequency microwave signals that also transmit data. The outgoing data transmissions, laser light and microwave radiation, are received by photodetectors or antennas disposed on remotely located components of a communications network.

As shown in FIG. 5, the electrical communications apparatus 10 includes an optical communications cluster which is networked through surface traces 68, 72, 76. As described herein, the electrical communications apparatus 10 operates in high frequency and optical bandwidths. A typical surface trace is subject to electrical losses and interference, including inductive and capacitive parasitics, propagation delays, signal-to-signal skews, signal-to-signal coupling, decreased signal strength, and alteration in the phase relationship of a signal.

In order to improve the overall efficiency of the electrical communications apparatus 10, it is preferred to route the electrical network of the optical communications cluster through the vias described herein and shown in FIGS. 3 and 4. By routing the current signals through the vias, the current-carrying conductor is insulated by the substrate 11 from any electrical interference. Moreover, by utilizing the vias as opposed to the surface traces, the overall length of conductance is shortened, thereby decreasing the effects of the electrical losses and parasitics referenced above. Nevertheless, the vias and surface traces may be utilized as part of the same electrical communications apparatus 10, depending upon the geometry and tolerance of the respective elements of the electrical communications apparatus 10.

As described, the present invention consists of an electrical communications device including a three-dimensional substrate, an antenna, and an optical communications cluster wherein the noted components are coupled through vias internal to the substrate. Nevertheless, it should be apparent to those skilled in the art that the above-described embodiments are merely illustrative of but a few of the many possible specific embodiments of the present invention. Numerous and various other arrangements can be readily devised by those skilled in the art without departing from the spirit and scope of the invention as defined in the following claims.

What is claimed is:

1. An electrical communications apparatus comprising:
   a dielectric material defining a volume, the dielectric material further defining a first planar surface, a second planar surface, and a third planar surface;
   at least two vias inscribed within the dielectric material, the at least two vias intersecting at least two of the first planar surface, the second planar surface, and the third planar surface and thereby providing a plurality of intersection points on the at least two of the first planar surface, the second planar surface, and the third planar surface;
   wherein the first planar surface, the second planar surface, and the third planar surface intersect along a first line, a second line, and a third line respectively, and further wherein the first line, the second line, and the third line are mutually perpendicular; and wherein the at least two vies are electrically conductive, and further wherein a GaAs antenna is in communication with at least one electrical device through the at least two vias.

2. The electrical communications apparatus of claim 1 wherein the GaAs antenna is connected to the dielectric material by a gold stud assembly.

3. The electrical communications apparatus of claim 2 wherein the gold stud assembly is of a predetermined length such that the GaAs antenna is distanced from the dielectric material by an air gap.

4. An electrical communications apparatus comprising:
 a dielectric material defining a volume, the dielectric material further defining a first planar surface, a second planar surface, and a third planar surface;
 at least two via inscribed within the dielectric material, the at least two vias intersecting at least two of the first planar surface, the second planar surface, and the third planar surface and thereby providing a plurality of intersection points on the at least two of the first planar surface, the second planar surface, and the third planar surface;

wherein the first planar surface, the second planar surface, and the third planar surface intersect along a first line, a second line, and a third line respectively, and further wherein the first line, the second line, and the third line are mutually perpendicular;

wherein the at least two vias are electrically conductive, and further wherein an antenna is in communication with at least one electrical device through the at least two vias; and wherein the at least one electrical device includes an optical communications cluster including optical communication electrical devices.

5. The electrical communications apparatus of claim 4 wherein the optical communications cluster includes at least a CMOS controller, a pin diode, and a vertical cavity surface emitting laser.

6. The electrical communications device of claim 4 wherein the optical communications cluster is adapted to receive a set of optical signals from a central controller, process the set of optical signals, and transmit a set of reply signals to the central controller.

* * * * *

UNITED STATES PATENT AND TRADEMARK OFFICE
CERTIFICATE OF CORRECTION

| | | |
|---|---|---|
| PATENT NO. | : 7,015,869 B2 | Page 1 of 1 |
| APPLICATION NO. | : 10/298434 | |
| DATED | : March 21, 2006 | |
| INVENTOR(S) | : C. Allen Marlow et al. | |

It is certified that error appears in the above-identified patent and that said Letters Patent is hereby corrected as shown below:

In the Claims

Column 5, in claim 1, line 3, before "are electrically" delete "vies" and substitute --vias-- in its place.

Column 5, in claim 4, line 19, before "inscribed within the" delete "via" and substitute --vias-- in its place.

Signed and Sealed this

Eleventh Day of July, 2006

JON W. DUDAS
*Director of the United States Patent and Trademark Office*